(12) United States Patent
Kapadia et al.

(10) Patent No.: US 12,119,367 B2
(45) Date of Patent: Oct. 15, 2024

(54) COMPOSITE SUBSTRATE FOR FABRICATING III-V PHOTODETECTOR ARRAYS

(71) Applicant: UNIVERSITY OF SOUTHERN CALIFORNIA, Los Angeles, CA (US)

(72) Inventors: Rehan Rashid Kapadia, Los Angeles, CA (US); Khaled Ahmed, San Jose, CA (US); Frank Greer, Pasadena, CA (US)

(73) Assignees: University of Southern California, Los Angeles, CA (US); California Institute of Technology, Pasadena, CA (US); InPi LLC, Los Angeles, CA (US)

( * ) Notice: Subject to any disclaimer, the term of this patent is extended or adjusted under 35 U.S.C. 154(b) by 491 days.

(21) Appl. No.: 17/443,380

(22) Filed: Jul. 26, 2021

(65) Prior Publication Data

US 2022/0028907 A1 Jan. 27, 2022

Related U.S. Application Data

(60) Provisional application No. 63/055,902, filed on Jul. 24, 2020.

(51) Int. Cl.
*H01L 27/146* (2006.01)
*H01L 31/0304* (2006.01)
*H01L 31/18* (2006.01)

(52) U.S. Cl.
CPC .... *H01L 27/1469* (2013.01); *H01L 27/14634* (2013.01); *H01L 31/03046* (2013.01); *H01L 31/1852* (2013.01)

(58) Field of Classification Search
CPC .......... H01L 27/1469; H01L 27/14634; H01L 27/14601; H01L 27/14683; H01L 31/03046; H01L 31/1852; H01L 31/1892
See application file for complete search history.

(56) References Cited

U.S. PATENT DOCUMENTS 7,067,853 B1 * 6/2006 Yao ....................... H01L 31/153
257/187
8,822,248 B2 * 9/2014 Park ................... H01L 21/02532
257/615

(Continued)

FOREIGN PATENT DOCUMENTS

CN 103531648 A * 1/2014
WO WO-2012155535 A1 * 11/2012 ......... H01L 21/0242

OTHER PUBLICATIONS

W. von Munch, "Gallium Arsenide Planar Technology," in IBM Journal of Research and Development, vol. 10, No. 6, pp. 438-445, Nov. 1966, doi: 10.1147/rd. 106.0438 (Year: 1966).*

(Continued)

*Primary Examiner* — Sitaramarao S Yechuri
(74) *Attorney, Agent, or Firm* — Brooks Kushman P.C.

(57) ABSTRACT

A method for forming a composite substrate containing layers of dissimilar materials is provided. The method includes a step of disposing a release layer over a base substrate where the base substrate is composed of a first material. A template layer is attached to the release layer. Characteristically, the template layer is composed of a second material and adapted to form a compound semiconductor device thereon.

28 Claims, 8 Drawing Sheets

(56) References Cited

U.S. PATENT DOCUMENTS

| | | | | |
|---|---|---|---|---|
| 2008/0105881 | A1* | 5/2008 | Kim | H01L 21/0254 |
| | | | | 257/E21.113 |
| 2012/0288998 | A1* | 11/2012 | Lee | H01L 24/97 |
| | | | | 257/E21.599 |
| 2013/0276888 | A1* | 10/2013 | Munteanu | H01L 31/03928 |
| | | | | 136/252 |

OTHER PUBLICATIONS

D. Alexiev "A Review of Liquid Phase Epitaxial Grown Gallium Arsenide" Condensed Matter > Materials Science 2004 arXiv: cond-mat/0408653 (Year: 2004).*

* cited by examiner

COMPOSITE SUBSTRATE FOR FABRICATING III-V PHOTODETECTOR ARRAYS

CROSS-REFERENCE TO RELATED APPLICATIONS

This application claims the benefit of U.S. provisional application Ser. No. 63/055,902 filed Jul. 24, 2020, the disclosure of which is hereby incorporated in its entirety by reference herein.

STATEMENT REGARDING FEDERALLY SPONSORED RESEARCH OR DEVELOPMENT

This invention was made with government support under Grant No. 80NMO0018D0004 awarded by NASA (JPL). The government has certain rights in the invention.

TECHNICAL FIELD

In at least one aspect, a composite substrate technology for fabricating III-V photodetector arrays is provided.

BACKGROUND

Imaging technology is the science of converting an image to a signal indicative thereof. Imaging systems have broad applications in many fields, including commercial, consumer, industrial, medical, defense and scientific markets. Imaging in the infrared spectral range is gaining significant traction for consumer electronics devices such as smartphones, tablets, and laptops.

InGaAs/InP materials are used to build infrared detectors for LIDAR applications. In particular, small and expensive wafers made of InP or GaAs are used to build the photodetectors arrays. This results in a very high cost for the IR imagers and the LIDAR system. For example, a 3" InP wafer costs ~$500 each. In addition, the available InP wafers, for example, are limited to 4" size, which is much smaller than the 12" wafers used to make state-of-the-art ROIC CMOS circuits on silicon wafers, making it harder to do wafer-to-wafer bonding using state-of-the-art and commercially available 12" size wafer-to-wafer bonding equipment.

Some prior art image sensors included an array of photosensitive elements in series with switching elements. Each photosensitive element receives an image of a portion of the scene being imaged. That portion is called a picture element or pixel. The image obtaining elements produce an electrical signal indicative of the image plus a noise component. Various techniques have been used in the art to minimize the noise, to thereby produce an output signal that closely follows the image.

Active pixel sensors use special techniques to integrate both the photodetector and the readout amplifier into the pixel area or an area adjacent to the pixel area. This allows the signal indicative of the pixel to be read out directly. These techniques have enabled the use of a logic family whose fabrication processes are compatible with CMOS. This has enabled the controlling circuitry to be made from CMOS or some other low power-dissipating logic family. This is valid for the situation when silicon photodetectors are used to detect visible light since silicon photodetectors can be manufactured adjacent the CMOS readout circuit.

For photodetectors made of materials that are not compatible with CMOS process, hybrid bonding has been used to connect the photodetectors to the readout integrated circuit (ROIC) made of CMOS. In this case, a photodetector array is built on a suitable substrate (that is different from silicon), and the ROIC is built on silicon wafers. The two wafers are bonded together using hybrid bonding technologies. Although this technique has had some success, it tends to perform poorly while being expensive.

Accordingly, there is a need for a substrate technology that provides for the fabrication of infrared imaging devices with low cost and high performance.

SUMMARY

In at least one aspect, a method for forming a composite substrate that includes layers of dissimilar materials is provided. The method includes a step of forming a release layer over a base substrate that is composed of a first material. A template layer is attached to the release layer. Characteristically, the template layer is composed of a second material and adapted to form a compound semiconductor device thereon.

In another aspect, a substrate technology is provided. The substrate technology enables growth of InGaAs-based detectors on large diameter silicon wafers (e.g. 12") that are compatible with large diameter silicon wafers used to fabricate the ROIC CMOS circuitry. Advantageously, substrate technology not only enables the reduction of cost per pixel for the photodetectors, but it enables the use of wafer-to-wafer bonding technologies to connect photodetectors to ROIC with very high throughput which reduces cost even further.

In another aspect, the substrate technology allows the fabrication of high-performance infrared imaging devices.

In another aspect, the substrate technology provides low manufacturing cost infrared imaging devices.

In another aspect, the substrate material includes an interposer sacrificial layer (i.e., a release layer) positioned between the base substrate and a growth substrate layer.

In another aspect, an InP nucleation crystalline layer is made on a substrate that has been coated with a release layer (e.g., metal) that can be ablated by an infrared laser through the silicon wafer. This allows separation (or release) of photodetectors (formed thereon) after they have been bonded to ROIC-containing wafer.

In another aspect, a method for forming a composite substrate containing layers of dissimilar materials is provided. The method includes steps of disposing a release layer over a base substrate that is composed of a first material and attaching a template layer to the release layer. Characteristically, the template layer is composed of a second material and adapted to form a compound semiconductor device thereon. Characteristically, the base substrate can be a silicon wafer. Advantageously, the silicon wafer is greater than 6" in diameter.

In another aspect, the second material in the composite substrate is a III-V compound semiconductor composed of mixtures of elements from group III and group V from the Periodic Table. Examples of the compound semiconductor can be selected from the group consisting of InP, GaAs, InGaAs, AlAs, AlSb, InAs, InN, GaP, GaAs, GaN, AlP, and AlN. Advantageously, the methods can be used to form a compound semiconductor device on a dissimilar substrate.

In another aspect, the compound semiconductor is grown on the silicon wafer by a growth technique.

In still another aspect, the growth technique is TLP growth (templated liquid phase growth).

In yet another aspect, the compound semiconductor is a single crystal.

In yet another aspect, the compound semiconductor is grown in a plurality of regions on a wafer. In a refinement, these regions are all single crystalline. In a further refinement, the regions all have the same crystal orientation.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

For a further understanding of the nature, objects, and advantages of the present disclosure, reference should be had to the following detailed description, read in conjunction with the following drawings, wherein like reference numerals denote like elements and wherein.

DETAILED DESCRIPTION

Reference will now be made in detail to presently preferred embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

With respect to the terms "comprising," "consisting of," and "consisting essentially of," where one of these three terms is used herein, the presently disclosed and claimed subject matter can include the use of either of the other two terms.

The phrase "composed of" means "including" or "consisting of" Typically, this phrase is used to denote that an object is formed from a material.

It should also be appreciated that integer ranges explicitly include all intervening integers. For example, the integer range 1-10 explicitly includes 1, 2, 3, 4, 5, 6, 7, 8, 9, and 10. Similarly, the range 1 to 100 includes 1, 2, 3, 4 . . . 97, 98, 99, 100. Similarly, when any range is called for, intervening numbers that are increments of the difference between the upper limit and the lower limit divided by 10 can be taken as alternative upper or lower limits. For example, if the range is 1.1. to 2.1 the following numbers 1.2, 1.3, 1.4, 1.5, 1.6, 1.7, 1.8, 1.9, and 2.0 can be selected as lower or upper limits.

The term "one or more" means "at least one" and the term "at least one" means "one or more." The terms "one or more" and "at least one" include "plurality" as a subset.

The term "substantially," "generally," or "about" may be used herein to describe disclosed or claimed embodiments. The term "substantially" may modify a value or relative characteristic disclosed or claimed in the present disclosure. In such instances, "substantially" may signify that the value or relative characteristic it modifies is within ±0%, 0.1%, 0.5%, 1%, 2%, 3%, 4%, 5% or 10% of the value or relative characteristic.

The term "deposited over" means that a layer is deposited such that is it disposed over another layer. In a refinement, deposited over" means that a layer is deposited such that it contacts another layer. For example, layer A deposited over layer B means that after deposition layer A is disposed over layer B. In a refinement, layer A contacts layer B.

The term "Group III metal" refers to aluminum (Al), gallium (Ga), indium (In), or thallium (Tl).

The term "Group V atom" refers to nitrogen (N), and phosphorus (P), the metalloids arsenic (As) and antimony (Sb).

Throughout this application, where publications are referenced, the disclosures of these publications in their entireties are hereby incorporated by reference into this application to more fully describe the state of the art to which this invention pertains.

Abbreviations

"CMOS" means complementary metal-oxide-semiconductor.
"LIDAR" means light detection and ranging.
"MBE" means molecular-beam epitaxy.
"MOCVD" means metal-organic chemical vapor deposition.
"ROIC" means readout integrated circuits.
"SWIR" means short-wavelength infrared.
"TLP" means templated liquid phase growth.

Referring to FIG. 1A-1E, a schematic flowchart depicting the fabrication of a compound semiconductor device and in particular, a photodetector array is provided. The method initially forms a first composite substrate $10^1$ that includes a base substrate 12. The method starts with base substrate 12 coated with buffer layer 14. In a refinement, the base substrate 12 can be a semiconductor wafer (e.g., a silicon wafer) or a glass sheet. Typically, the buffer layer 14 is a dielectric layer and in particular, an insulating oxide layer such as silicon oxide. Buffer layer 14 is deposited (e.g., by CVD) onto base substrate 12. Buffer layer 14 can also include a native oxide on a silicon substrate.

Figure 1A:
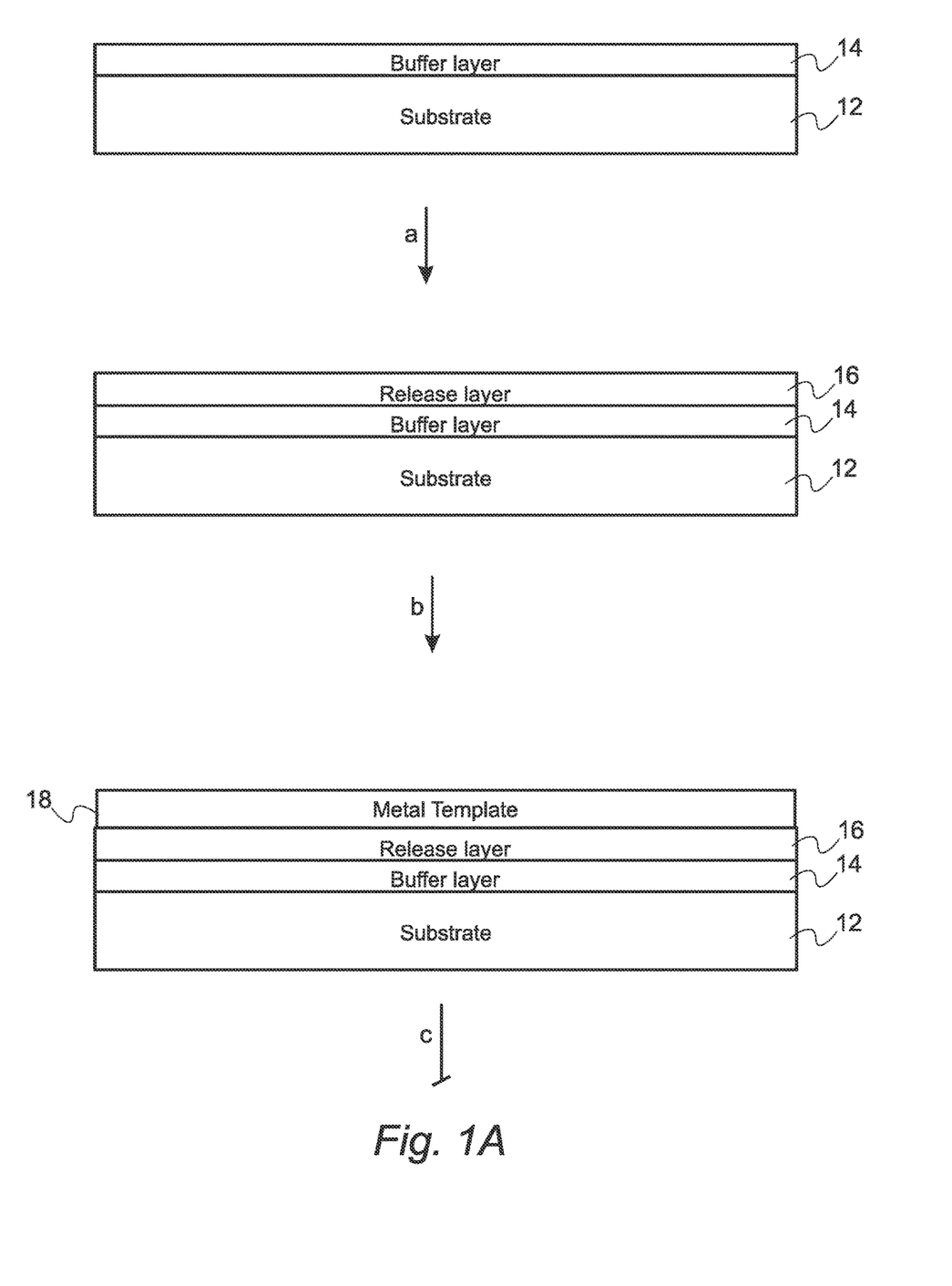
FIGS. 1A, 1B, 1C, 1D, 1E, 1F, and 1G. Schematic flow chart for the formation of photodetector array.

Referring to FIG. 1A, interposer sacrificial layer 16 is deposited over buffer layer 14 in step a). In step b), a metal template layer 18 is deposited over the release layer 16. In a refinement, metal template layer 18 is composed of a Group III metal. Characteristically, interposer sacrificial layer 16 is a release layer. In some refinements, the release layer can be composed of an oxide, a metal, or a semiconductor. In the case of an oxide layer or semiconductor layer, the interposer sacrificial layer behaves as a sacrificial release layer. In a refinement, the release layer has an orthogonal etch with respect to a base substrate layer composed of a crystalline semiconductor layer. This allows the active crystalline semiconductor layer to be released from the growth substrate with a wet or dry chemical etch. Additionally, the release layer can be removed through ablation with an incident photon source as set forth below. The incident photons typically have a light wavelength greater than about 1200 nm so that the silicon substrate is transparent to the light. Specific examples for release layer 16 include, but are not limited to, e.g., Mo, NbN, or TiN. The interposer sacrificial layer 16 can be deposited by any number of physical deposition or chemical vapor deposition techniques such as sputtering, arc discharge deposition, evaporation, and the like.

Figure 1B:
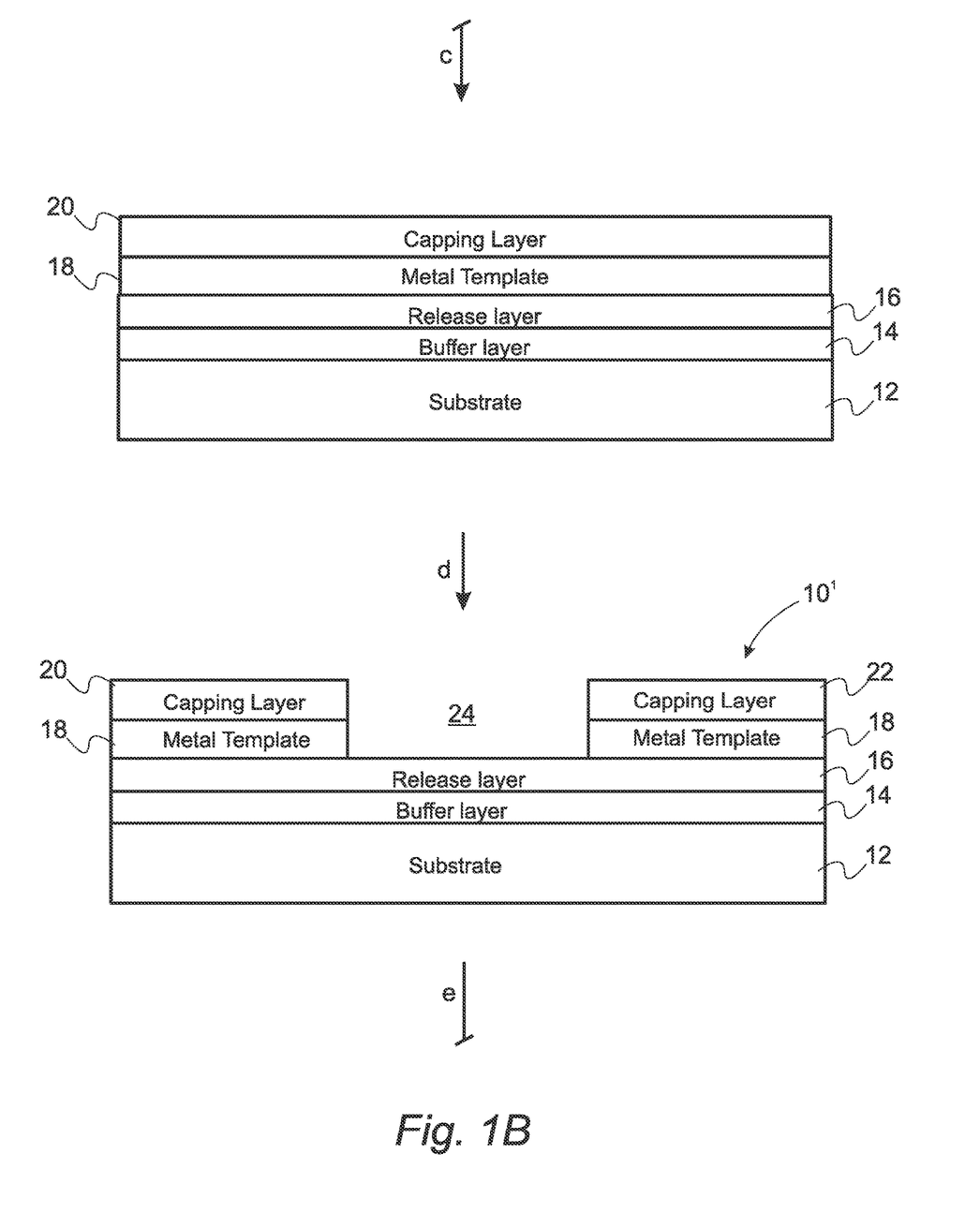

Referring to FIG. 1B, capping layer 20 (e.g., $SiO_x$) is deposited over the metal template layer 17 in step c). Typically, the capping layer 20 is deposited by evaporation or sputtering and is composed of a dielectric layer such as a silicon oxide (e.g., $SiO_x$ where x is typically 1.8 to 2.1 and optimally 2). In some variations, the thickness of the base substrate (e.g., a silicon wafer) is about 700 μm, the buffer layer is from about 100 to 200 nm, the release layer is from about 10 to 50 nm, a metal template is about 1000 nm, and the capping layer is about 10 nm. In step d), first composite substrate $10^1$ is formed by patterning a metal template layer 18 and capping layer 20 to provide a first set of separated template units 22 separated by a first plurality of trenches 24.

Figure 2A:
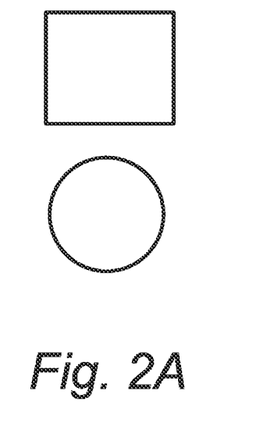
FIGS. 2A and 2B. Schematic cross-section illustrating photodetector pixels with different shapes.
Figure 2B:
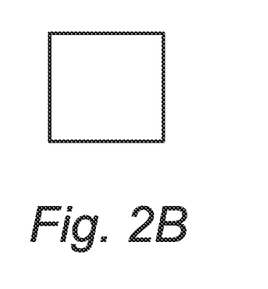
Figure 3:
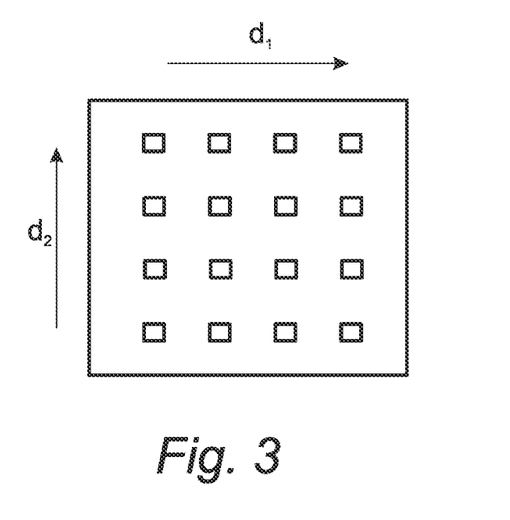
FIG. 3. Schematic cross-section illustrating an array of photodetector pixels.

The cross-section of each template unit 22 is not limited to any particular geometric shape. The cross-section can be circular as depicted in FIG. 2A or rectangular or square as depicted in FIG. 2B. In a refinement, each template unit can have a maximum dimension (parallel to the base substrate) from about 1 to 25 microns. In a refinement, each template unit can have a maximum dimension (parallel to the base substrate) from about 4 to 15 microns. In still another refinement, each template unit has dimensions (parallel to the base substrate) from about 4×4 microns to about 15×15 microns. When the compound semiconductor device that is fabricated on the template unit is a photodector, each pixel thereof can also have these dimensions. Moreover, typically there will be a plurality of template units that are arranged in an array, as depicted in FIG. 3. Such an array is 2 dimensional typically having from about 100 units to about 10,000 units along each of the two perpendicular dimensions di, dz. A corresponding array of compound semiconductor devices can be fabricated on the array of template units as set forth below. Such an array of compound semiconductor devices will reflect these number of units along each perpendicular direction. For example, a photodector fabricated from the array of such template units can have a resolution from 1 to 25 megapixels or greater.

Figure 1C:
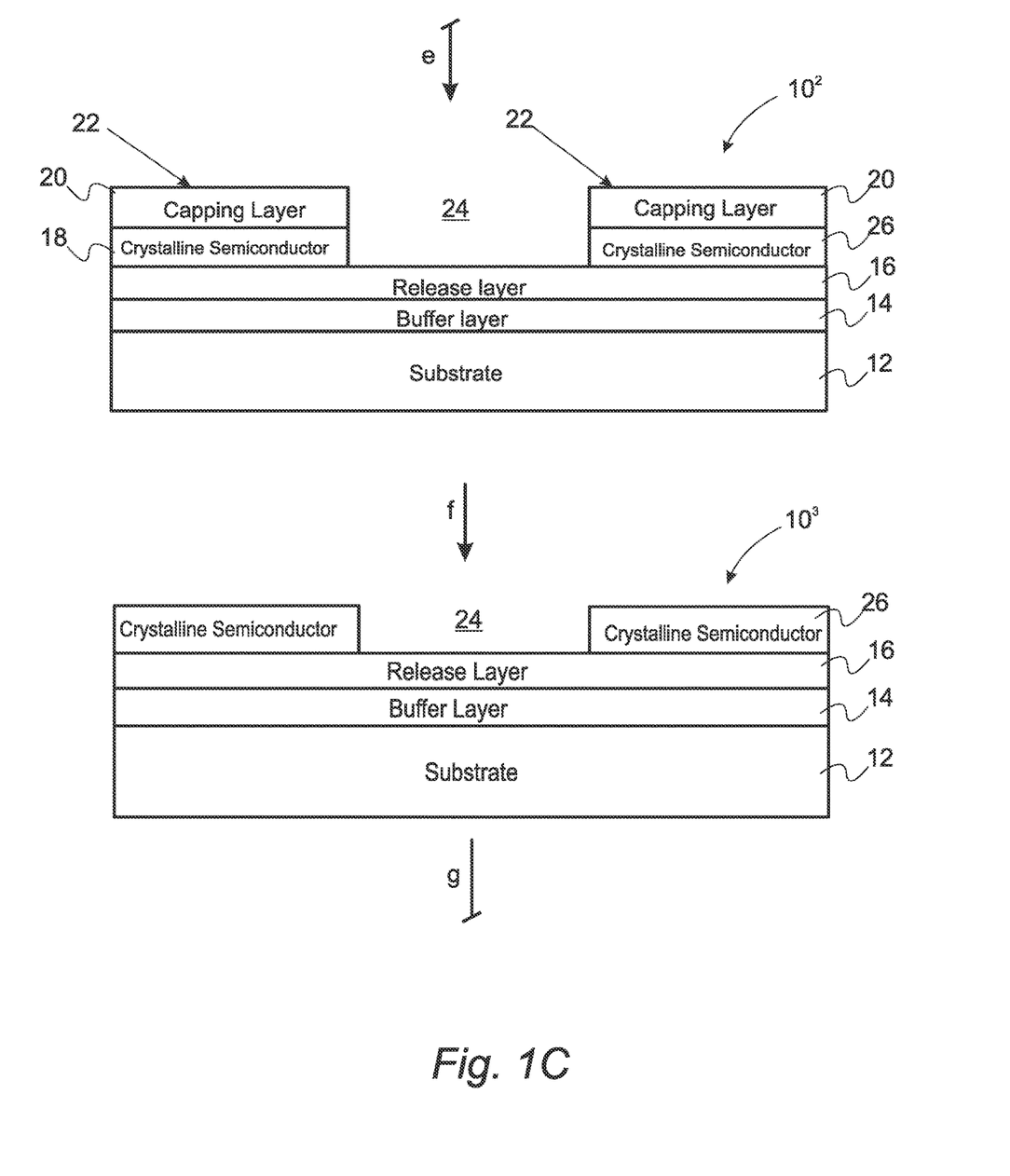

Referring to FIG. 1C, the second composite substrate $10^2$ is formed by annealing in ambient gas first composite substrate $10^1$ in step e). In a refinment, the ambient gas incudes a Group V atom. Therefore, metal template layer 18 is converted to first crystalline semiconductor layer 26, which is interposed between release layer 16 and capping layer 20. Examples of ambient gases that can be used include, but are not limited to, As-containing gas, phosphine-containing gas, and the like. In step f), third composite substrate $10^3$ is formed by selectively removing capping layer 20 to expose crystalline semiconductor layer 26.

In some variations, the first crystalline semiconductor layer 26 be a single composition binary III-V grown via the templated liquid phase growth technique. The III-V crystalline material can be a single crystal in the entire template region. Examples of the III-V single crystal material include InP, InAs, InN, GaP, GaAs, GaN, AlP, AlN, and AlAs.

In some variations, first crystalline semiconductor layer 26 is a ternary III-V semiconductor grown via the templated liquid phase growth technique. Typically, first crystalline semiconductor layer 26 will be a single crystal in the entire template region. Examples of the III-V single crystalline material include $InGa_xAs_{1-x}$, $InP_xAs_{1-x}$, and $InGa_xP_{1-x}$, where x represents the fraction of the element, with x varying from 0<x<1. In a refinement, variance in x will be smaller than 0.01 over the entire template region. In another refinement, x will vary from one fraction, a, to another fraction, b, where 0<a<1, and 0<b<1, and a<b over the entire template region. This variation may be smooth, with the local composition x varying smoothly from x=a to x=b spatially across the template, or abrupt, where the material has a single composition x=a over one portion of the template and x=b over another portion of the template.

In some variations, first crystalline semiconductor layer 26' has crystalline layer geometry is a compact 2-D shape from the plan view, an array of compact 2-D shapes, or a continuous mesh shape.

In some variations, first crystalline semiconductor layer 26' will serve as a crystalline seed for the growth of a subsequent MOCVD or MBE III-V epitaxial layer. The epitaxial layer may be comprised of a semiconductor layer with a single doping region, or multiple vertical doping regions.

In some variations, first crystalline semiconductor layer 26' will serve as a crystalline seed for the growth of a MOCVD or MBE III-V heteroepitaxial layer disposed over the crystalline layer. The heteroepitaxial layer may be comprised of a semiconductor layer with a single composition region or multiple layers with differing compositions.

In some variations, first crystalline semiconductor layer 26' will serve as a crystalline seed for the growth of a follow-up MOCVD or MBE III-V heteroepitaxial layer. The heteroepitaxial layer may be comprised of a semiconductor quantum well layer with an active layer with a thickness sufficient to produce quantum confinement and two cladding layers.

Figure 1D:
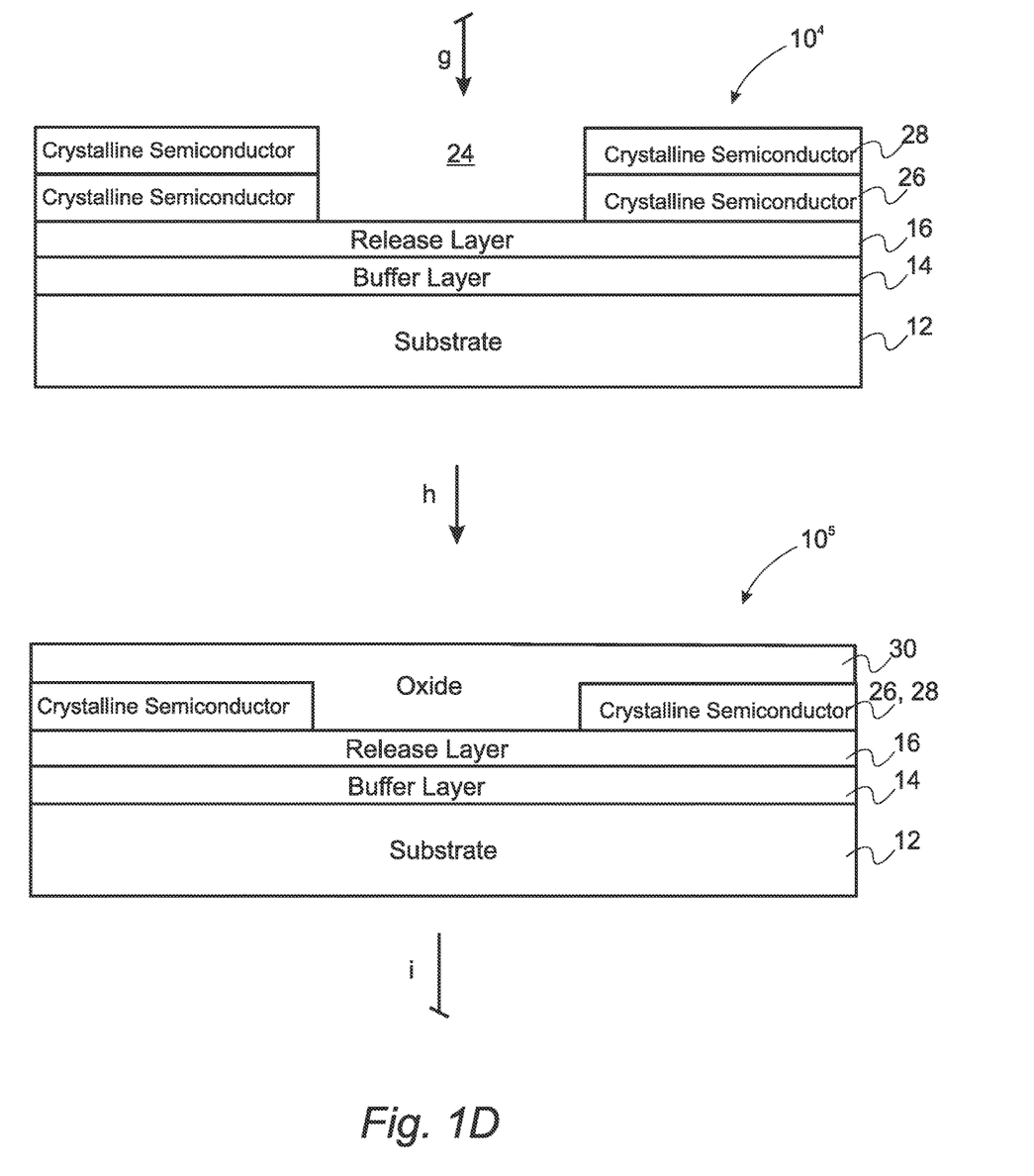

Referring to FIG. 1D, fourth composite substrate $10^4$ is formed by selectively growing a second semiconductor layer 28 over first semiconductor layer 26 in step g). After this semiconductor growth, fourth composite substrate $10^4$ includes second semiconductor layer 28 which is disposed over and typically contacts first semiconductor layer 26. In a refinement, second semiconductor layer 28 can be deposited by MOCVD or MBE growth methods. An example of the second semiconductor layer is InGaAs. It should be appreciated second semiconductor layer 28 can represent a plurality of layers. Moreover, first semiconductor layer 26, second semiconductor layer 28, and any additional semiconductor layers can be configured to form a compound semiconductor device thereon such as a photodetector. For example, when the compound semiconductor device is a photodetector, second semiconductor layer 28 can be a PN or PIN junction or another photoactive junction. In a refinement, first semiconductor layer 26 can be heavily doped with the semiconductor device deposted thereon. In step h), fifth composite substrate $10^5$ is formed by deposition and planarization of an oxide layer is 30 provided. After this deposition, fifth composite substrate $10^5$ includes oxide layer 30 disposed over semiconductor layers 26, 28. Examples for the oxide layer include $SiO_2$, SiOC, and the like.

Figure 1E:
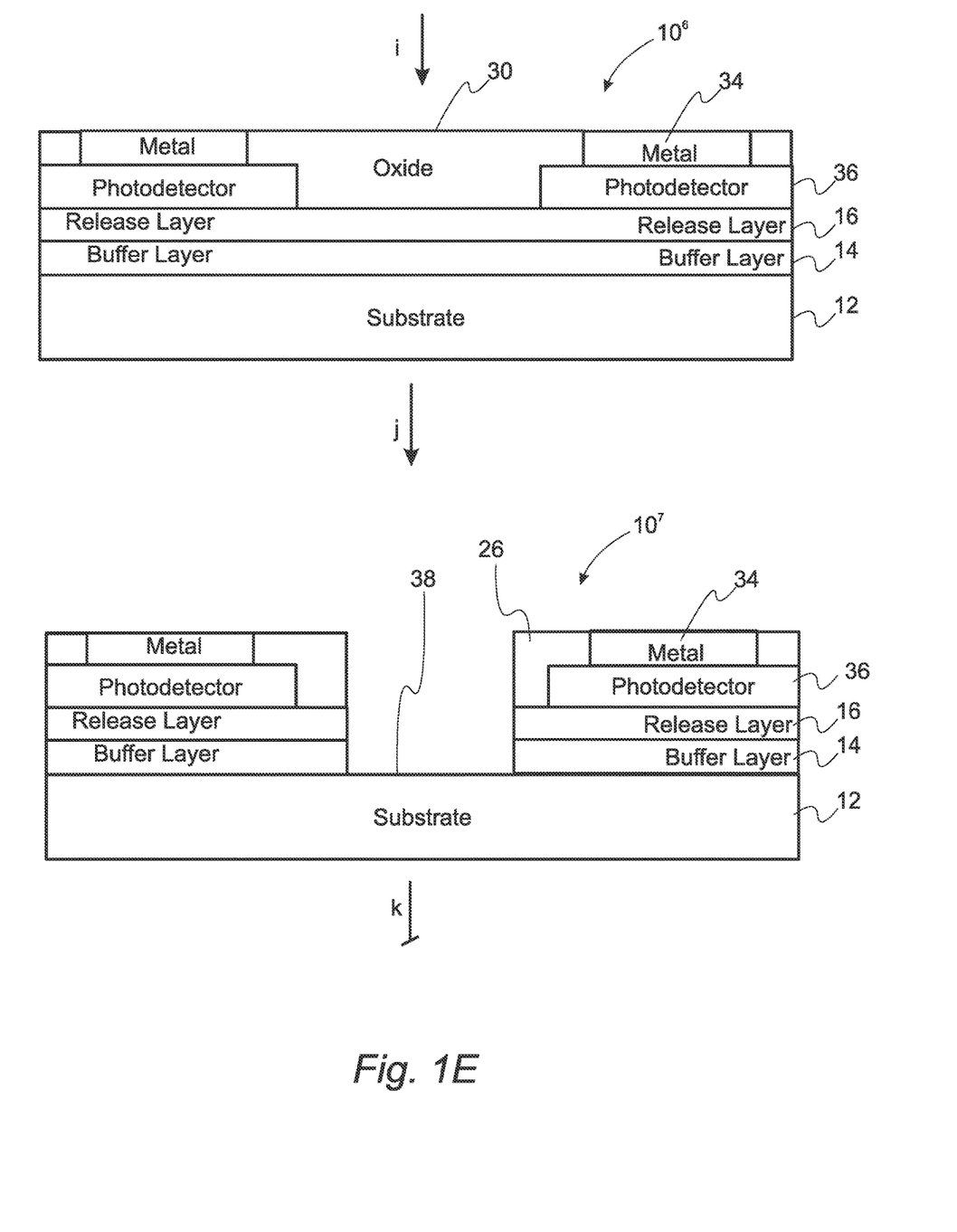

Referring to FIG. 1E, a portion of oxide layer 30 is selectively removed and metal contacts 34 grown in the trenches thus formed in step i). After this step, sixth composite substrate $10^6$ includes metal contacts 34 that typically contact. In a refinement, the metal contacts are formed by a damascene process flow. Examples of metal contacts can be composed of copper. At this stage, the combination of first semiconductor layer 22, second semiconductor layer 26, and any additional layers is referred to as compound semiconductor device 36 (e.g., a photodetector).

In step j), singulation of the compound semiconductor devices is preformed to form seventh composite substrate $10^7$. At this stage, the oxide layer 30, release layer 16, and buffer layer 14 are etched all the way down to the top substrate surface 38 of base substrate 12 is done using lithographic patterning and dry etch processes.

Figure 1F:
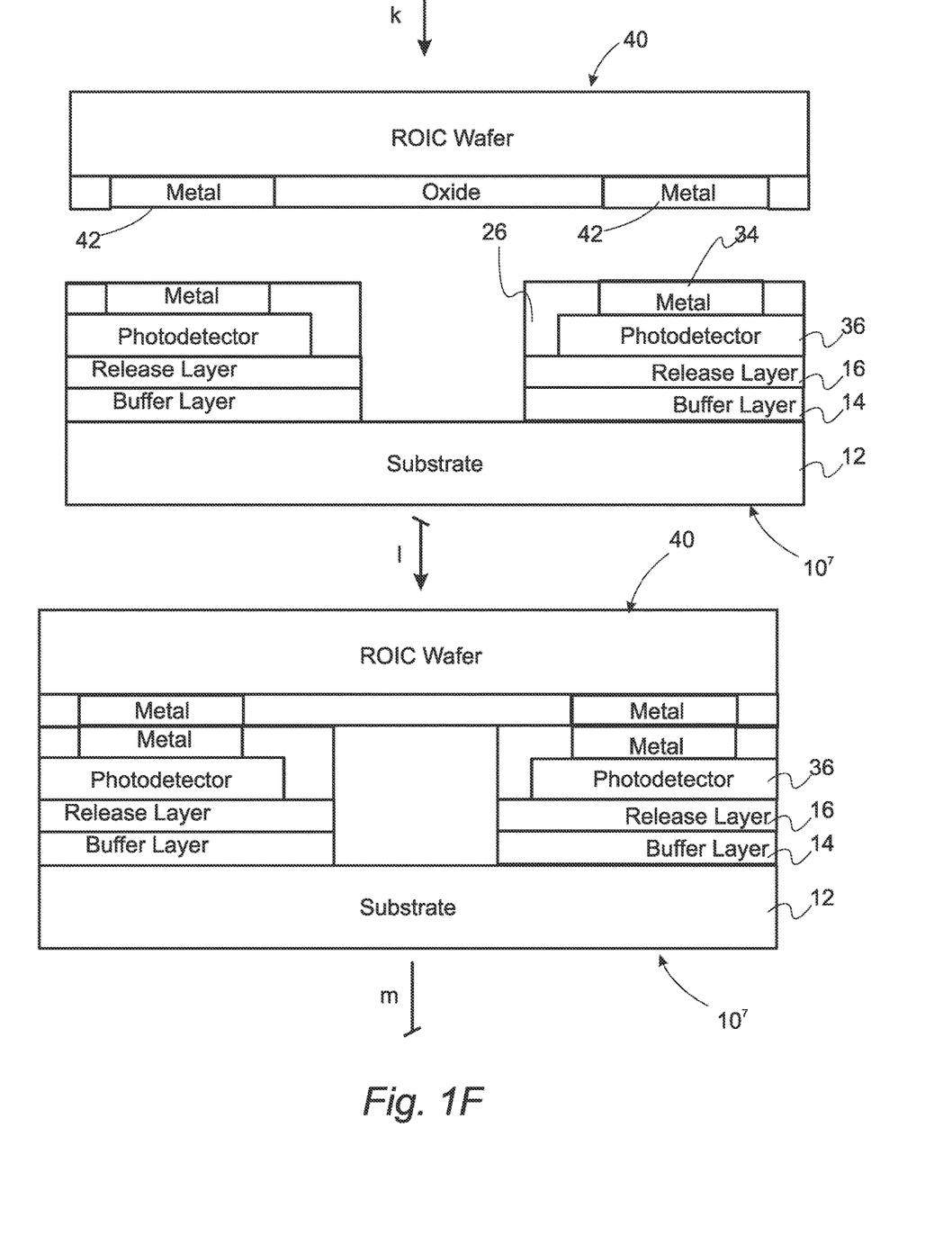

Referring to FIG. 1F, an ROIC wafer that has metal interconnect pads 40 (e.g., copper) embedded in oxide (using damascene process flow) which is to contact seventh substrate $10^7$ is provided in step k). In step l), seventh substrate $10^7$ and ROIC wafer 34 are aligned in a wafer-to-wafer bonder such that metal pads are facing each other.

Figure 1G:
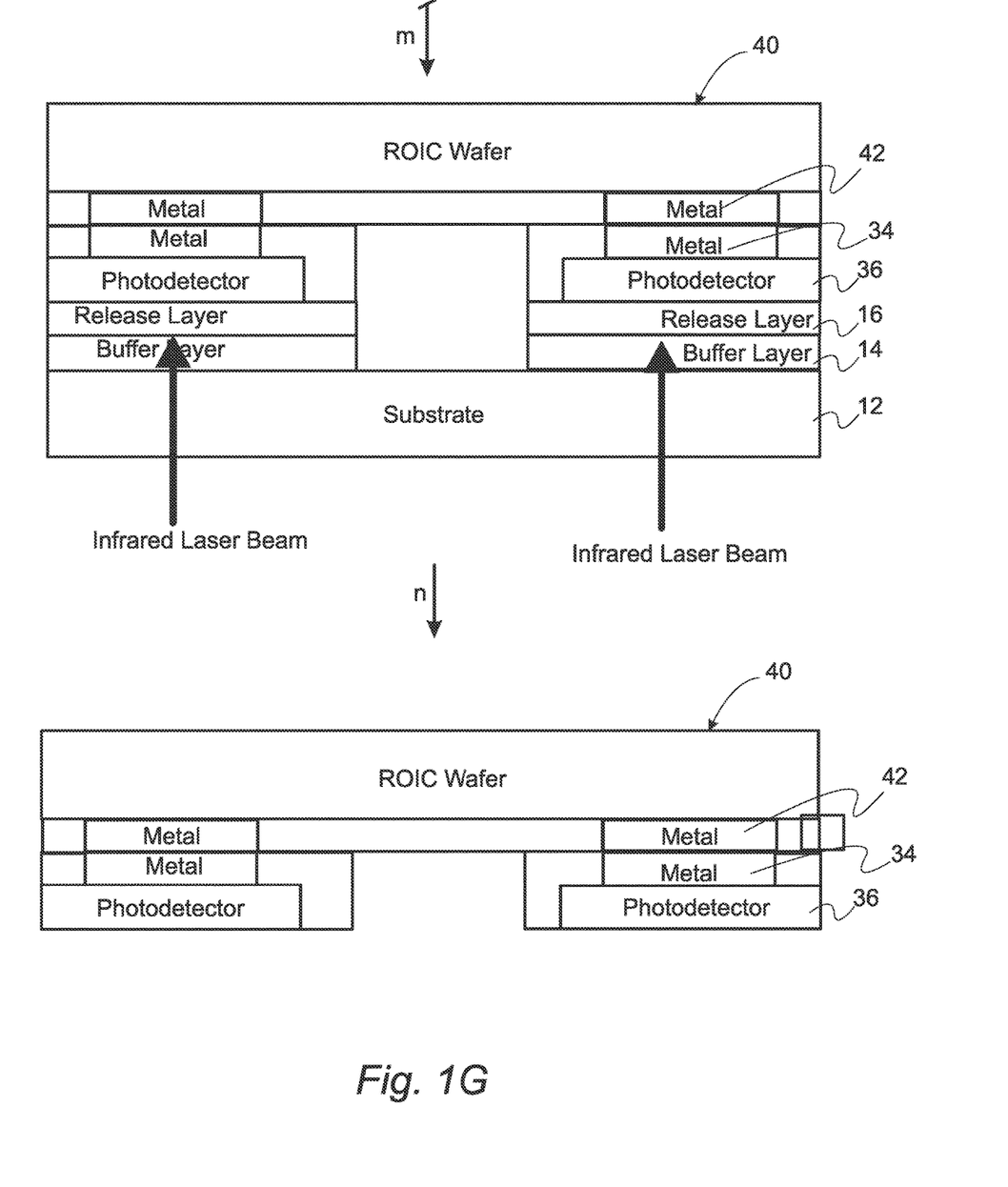

Referring to FIG. 1G, the hybrid copper-to-copper and oxide-to-oxide bonding in a wafer-to-wafer bonding apparatus in which ROIC wafer 34 is bonded to seventh substrate $10^7$ is performed as depicted in step m). In step n), release layer 16 is removed. For example, during infrared laser beam irradiation from the bottom substrate (e.g., Si) side, to ablate the release layer ablated thereby releasing the photodetectors bonded to the ROIC wafer. In step n), the photodetectors hast are attached to the to the ROIC wafer is provided.

As set forth above, the method can be used to form a compound semiconductor device on a dissimilar substrate. In this variation, the base substrate layer can be a silicon wafer. As set forth above, the silicon wafer can greater than 6" in diameter. In a refinement, one or more compound semiconductor layers are disposed over the base substrate layer. As set forth above, the compound semiconductor can be selected from the group consisting of InP, GaAs, InGaAs, AlAs, AlSb, InAs, InN, GaP, GaAs, GaN, AlP, and AlN.

In a variation, the compound semiconductor device is grown on the silicon wafer by a growth technique. An example of the growth technique is TLP growth (templated liquid phase growth) that forms a TLP layer. In a refinement, the TLP layer acts as a template for a second growth step. Examples for the second growth step include, but are not limited to, MOCVD and MBE.

In another variation, the compound semiconductor device is a single crystal. Advantageously, a plurality of compound semiconductor devices are formed in different regions on the silicon wafer. In a refinement, the different regions are all single crystalline. In a further refinement, the different regions all have the same crystal orientation.

In still another variation, the compound semiconductor device is sensitive to photons. Examples of devices sensitive to photons include, but are not limited to, photodetectors and SWIR detectors. In a further refinement, the compound semiconductor device is designed for LIDAR applications.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method for forming a composite substrate containing layers of dissimilar materials, the method comprising:
   forming a release layer over a base substrate having a buffer layer, the base substrate being composed of a first material;
   attaching a metal template layer to the release layer, the metal template layer being composed of a Group III metal;
   depositing a capping layer over the metal template layer, the capping layer being composed of a dielectric material;
   patterning the metal template layer and the capping layer to form a first composite substrate including a first plurality of separated template units separated by a first plurality of trenches;
   annealing the first composite substrate in an ambient gas to form a second composite substrate wherein metal template layer is converted to a first crystalline semiconductor layer which is interposed between the buffer layer and the capping layer; and
   removing the capping layer to form a third composite substrate such that the first crystalline semiconductor layer is exposed.

2. The method of claim 1, wherein the base substrate is a silicon wafer.

3. The method of claim 1, wherein the ambient gas includes a Group V atom and the first crystalline semiconductor layer is composed of a III-V compound semiconductor.

4. The method of claim 3, wherein the III-V compound semiconductor is selected from the group consisting of InP, GaAs, InGaAs, AlAs, AlSb, InAs, InN, GaP, GaAs, GaN, AlP, and AlN.

5. The method of claim 3, wherein the III-V compound semiconductor is grown on the base substrate by templated liquid phase growth.

6. The method of claim 5, wherein the III-V compound semiconductor is a single crystal.

7. The method of claim 5, wherein the III-V compound semiconductor is grown in a plurality of regions on the base substrate.

8. The method of claim 7, wherein the regions all have the same crystal orientation.

9. The method of claim 1, further comprising selectively growing a second semiconductor layer over the first crystalline semiconductor layer to form a fourth composite substrate.

10. The method of claim 9, further comprising:
    forming a fifth composite substrate by depositing an oxide layer over the second semiconductor layer and which the trenches and then planarization the oxide layer;
    forming a sixth composite substrate by selectively removing a portion of oxide layer to form a second set of trenches and growing metal contacts in the second set of trenches; and forming a seventh composite substrate by singularizing a plurality of compound semiconductor devices wherein the oxide layer, release layer, and buffer layer are etched to a substrate surface of the base substrate.

11. The method of claim 10, aligning and attaching readout integrated circuits to the seventh composite substrate.

12. The method of claim 9, wherein at least one compound semiconductor device including the first crystalline semiconductor layer and the second semiconductor layer is formed.

13. The method of claim 12, wherein a plurality of compound semiconductor devices are formed in different regions on the base substrate.

14. The method of claim 12, wherein the at least one compound semiconductor device is sensitive to photons.

15. The method of claim 12, wherein the at least one compound semiconductor device is a photodetector.

16. The method of claim 12, wherein the compound semiconductor device is a SWIR detector.

17. The method of claim 12, wherein the compound semiconductor device is designed for LIDAR applications.

18. A composite substrate comprising:
a base substrate;
a buffer layer disposed over the base substrate;
a release layer disposed over the buffer layer;
a first crystalline semiconductor layer disposed over the release layer;
a second semiconductor layer disposed over the first crystalline semiconductor layer; and
an oxide layer is disposed over the first crystalline semiconductor layer and the second semiconductor layer.

19. The composite substrate of claim 18 wherein the base substrate is a silicon wafer.

20. The composite substrate of claim 19 wherein the release layer is composed of a component selected from the group consisting of Mo, NbN, and TiN.

21. The composite substrate of claim 18, the buffer layer has a thickness from about 100 to 200 nm and the release layer has a thickness from about 10 to 50 nm.

22. The composite substrate of claim 18, wherein the first crystalline semiconductor layer is composed of InP, GaAs, InGaAs, AlAs, AlSb, InAs, InN, GaP, GaAs, GaN, AlP, or AlN.

23. The composite substrate of claim 18, wherein the second semiconductor layer is composed of InGaAs.

24. The composite substrate of claim 23, wherein a compound semiconductor device includes the first crystalline semiconductor layer and the second semiconductor layer.

25. The composite substrate of claim 24, wherein the compound semiconductor device is a photodetector.

26. The composite substrate of claim 18 further comprising metal contacts embedded in the oxide layer.

27. The composite substrate of claim 26, wherein an ROIC wafer having metal interconnect pads embedded in oxide is bonded to the composite substrate.

28. The composite substrate of claim 27, wherein the release layer is configured to be removable to release photodetectors bonded to the ROIC wafer.

* * * * *